(12) United States Patent
Heid et al.

(10) Patent No.: US 9,253,869 B2
(45) Date of Patent: Feb. 2, 2016

(54) DEVICE AND METHOD FOR COLLECTING ELECTRICALLY CHARGED PARTICLES

(75) Inventors: Oliver Heid, Erlangen (DE); Timothy Hughes, Erlangen (DE)

(73) Assignee: SIEMENS AKTIENGESELLSCHAFT (DE)

( * ) Notice: Subject to any disclaimer, the term of this patent is extended or adjusted under 35 U.S.C. 154(b) by 0 days.

(21) Appl. No.: 14/402,380

(22) PCT Filed: Jun. 4, 2012

(86) PCT No.: PCT/EP2012/060477
§ 371 (c)(1),
(2), (4) Date: Nov. 20, 2014

(87) PCT Pub. No.: WO2013/182219
PCT Pub. Date: Dec. 12, 2013

(65) Prior Publication Data
US 2015/0305134 A1    Oct. 22, 2015

(51) Int. Cl.
*H05H 5/06* (2006.01)
*H05H 5/04* (2006.01)
*H05H 5/00* (2006.01)
*H05H 15/00* (2006.01)
*H01J 37/244* (2006.01)

(52) U.S. Cl.
CPC .............. *H05H 5/066* (2013.01); *H01J 37/244* (2013.01)

(58) Field of Classification Search
USPC .............. 250/281–283, 291, 492.3, 469, 526; 315/502, 503, 506, 507; 73/863.12, 73/863.21; 96/15
See application file for complete search history.

(56) References Cited

U.S. PATENT DOCUMENTS

| | | | | |
|---|---|---|---|---|
| 2,307,602 A | * | 1/1943 | Penney | G01N 1/2202 73/28.02 |
| 6,900,433 B2 | * | 5/2005 | Ding | H01J 49/427 250/282 |
| 7,989,758 B2 | * | 8/2011 | Koster | H01J 49/0045 250/282 |
| 8,378,311 B2 | * | 2/2013 | Balakin | A61N 5/10 250/396 R |
| 8,637,833 B2 | * | 1/2014 | Balakin | A61N 5/10 250/396 R |
| 8,901,491 B2 | * | 12/2014 | Brekenfeld | H01J 49/424 250/281 |

(Continued)

FOREIGN PATENT DOCUMENTS

| | | |
|---|---|---|
| EP | 0412896 A1 | 2/1991 |
| WO | 2011104081 A1 | 9/2011 |
| WO | 2011104083 A1 | 9/2011 |

OTHER PUBLICATIONS

International Search Report for PCT Application No. PCT/EP2012/060477, International Filing Date: Jun. 4, 2012; 3 pgs.

(Continued)

*Primary Examiner* — Bernard E Souw
(74) *Attorney, Agent, or Firm* — Schmeiser Olsen & Watts LLP

(57) ABSTRACT

A device for collecting electrically charged particles comprising a first shell and a second shell disposed concentrically around the first shell is provided. Each of the shells is divided respectively into a first half-shell and a second half-shell. A first switch is disposed between the first half-shell of the first shell and the second half-shell of the first shell. A second switch is disposed between the second half-shell of the first shell and the first half-shell of the second shell. The first half-shell of the second shell has a through opening.

10 Claims, 2 Drawing Sheets

(56) References Cited

U.S. PATENT DOCUMENTS 8,907,271 B2 * 12/2014 Koster ............... H01J 49/4245
  250/281
2011/0284761 A1 * 11/2011 Balakin .................. A61N 5/10
  250/396 R

OTHER PUBLICATIONS

Macleod C et al: 11A Reconsideration of Electrostatically Accelerated and Confined Nuclear Fusion for Space Applications, Journal of the British Interplanetary Society, British Interplanetary Society, London, GB. vol. 63. No. 5/6, Dec. 6, 2010, pp. 192-205.

* cited by examiner

DEVICE AND METHOD FOR COLLECTING ELECTRICALLY CHARGED PARTICLES

CROSS-REFERENCE TO RELATED APPLICATION

This application claims priority to PCT Application No. PCT/EP2012/060477, having a filing date of Jun. 4, 2012, the entire contents of which is hereby incorporated by reference.

FIELD OF TECHNOLOGY

The following relates to a device for collecting electrically charged particles, a method for operating a device for collecting electrically charged particles, a device for irradiating a target with a particle beam, and a method for operating a device for irradiating a target with a particle beam.

BACKGROUND

For applications such as the production of radioisotopes or neutrons, it is common practice to bombard a comparatively thick target with a beam of charged particles from a particle accelerator in order to cause desired nuclear reactions in said target. Here, the particle accelerator can be e.g. a radiofrequency linear accelerator. By way of example, the charged particles can be protons.

The generation of the accelerated particle beam is connected with a significant energy input. In the case where a thick target is used, the energy transferred to the charged particles as kinetic energy by the particle accelerator largely remains in the target after the particles impact on said target. Some of the energy is emitted as bothersome x-ray bremsstrahlung. The energy remaining in the target leads to heating of the target, which makes cooling of the target necessary. The maximum possible cooling power restricts the maximum employable flux of particles shot at the target.

The portion of the energy used for desired nuclear reactions is small when a thick target is used since the desired nuclear reactions are generally only possible in a tightly delimited energy interval of the energy of the impacting particles.

SUMMARY

An aspect relates to a device with which an energy efficiency in such arrangements can be increased. It is a further aspect of the present invention to specify a method by means of which an energy efficiency can be increased when operating such arrangements. It is a further aspect of the present invention to specify a device for irradiating a target with a particle beam, which device has an increased energy efficiency. It is furthermore an aspect of the present invention to specify a method for operating a device for irradiating a target with a particle beam, which method has an improved energy efficiency. Preferred developments are specified in the dependent claims.

A device according to embodiments of the invention for collecting electrically charged particles comprises a first shell and a second shell arranged concentrically around the first shell. Here, each one of the shells is respectively subdivided into a first half shell and a second half shell. A first switch is arranged between the first half shell of the first shell and the second half shell of the first shell. A second switch is arranged between the second half shell of the first shell and the first half shell of the second shell. Moreover, the first half shell of the second shell comprises an opening. Advantageously, in this device, charged particles with kinetic energy may impact on the first half shell of the first shell through the opening in the second shell and charge the said first half shell. As a result, the kinetic energy of the particles can be converted into electrical energy.

In a development of the device, at least one further shell is arranged concentrically around the second shell. Here, each further shell is respectively subdivided into a first half shell and a second half shell. The first half shell of each further shell respectively comprises an opening. Moreover, in each shell except for the outermost shell, a first switch is respectively arranged between the respective first half shell and the respective second half shell and a second switch is respectively arranged between the respective second half shell and a first half shell of the respectively next further out shell. Advantageously, the device then has a relatively large number of steps, as a result of which recouping large amounts of energy from particles with a high kinetic energy is made possible without the electrical energy generated by the device needing to be picked up at the device with a high voltage level.

In a preferred embodiment of the device, the shells have a spherical embodiment. Advantageously, this then results in a uniform field distribution, which simplifies insulating the shells of the device.

In one embodiment of the device, a rectifier is arranged between the first half shell of the outermost shell and the second half shell of the outermost shell. Advantageously, the rectifier can then be used to rectify an AC voltage generated by the device.

In a development of the device, the latter comprises an AC source, which is connectable to the first half shell of an outermost shell and the second half shell of the outermost shell. Advantageously, the AC source can then be used to charge the shells of the device at the start of operation of the device, as a result of which efficient operation of the device is made possible already from the start of operation of the device.

In a method according to embodiments of the invention for operating a device for collecting electrically charged particles, in which the device is embodied in accordance with the type set forth above, all first switches and all second switches are alternately opened and closed. Advantageously, the method then divides a high voltage existing between the first half shell of the innermost shell of the device and the first half shell of the outermost shell of the device down into AC voltage with a reduced peak value compared to the high voltage, which AC voltage can be picked up between the half shells of the outermost shell of the device.

In a development of the method, the device, as described above, is embodied with an AC source. Here, the AC source is connected to the first half shell of the outermost shell and the second half shell of the outermost shell at the start of the method. Subsequently, all first switches and all second switches are alternately opened and closed synchronously with the clock of an AC voltage generated by the AC source. Advantageously, the method then renders it possible to charge the shells of the device at the start of operation of the device to inwardly increasing potential levels, as a result of which efficient operation of the device is made possible already from the start of operation of the device.

A device according to embodiments of the invention for irradiating a target with a particle beam comprises a particle accelerator for generating a beam of charged particles, a target and a device for collecting electrically charged particles embodied in accordance with the type set forth above. Advantageously, the device for collecting electrically charged particles then enables the collection of particles, which have passed through the target, and the recuperation of the energy therefrom. As a result of this, the energy efficiency of the device for irradiating the target with the particle beam advantageously increases.

In a development of the device, the particle accelerator is embodied as a linear accelerator. Advantageously, linear accelerators are suitable for generating beams of charged particles with particle energies relevant to the generation of radioisotopes and neutrons.

In a method according to embodiments of the invention for operating a device for irradiating a target with a particle beam, the device for irradiating the target with the particle beam is embodied in accordance with the type set forth above. Moreover, the beam of charged particles, in this case, is directed onto the target in such a way that at least some particles penetrate the target. Here, the device for collecting electrically charged particles is arranged in such a way that at least some of the particles penetrating the target enter the device for collecting electrically charged particles. In so doing, the device for collecting electrically charged particles is operated in accordance with the method described above. Advantageously, in this method, particles which completely penetrate the target are collected and the energy thereof is recuperated. As a result, the whole method for operating the device for irradiating the target with the particle beam advantageously has an expedient energy efficiency.

BRIEF DESCRIPTION

Some of the embodiments will be described in detail, with reference to the following figures, wherein like designations denote like members, wherein.

DETAILED DESCRIPTION

Figure 1:
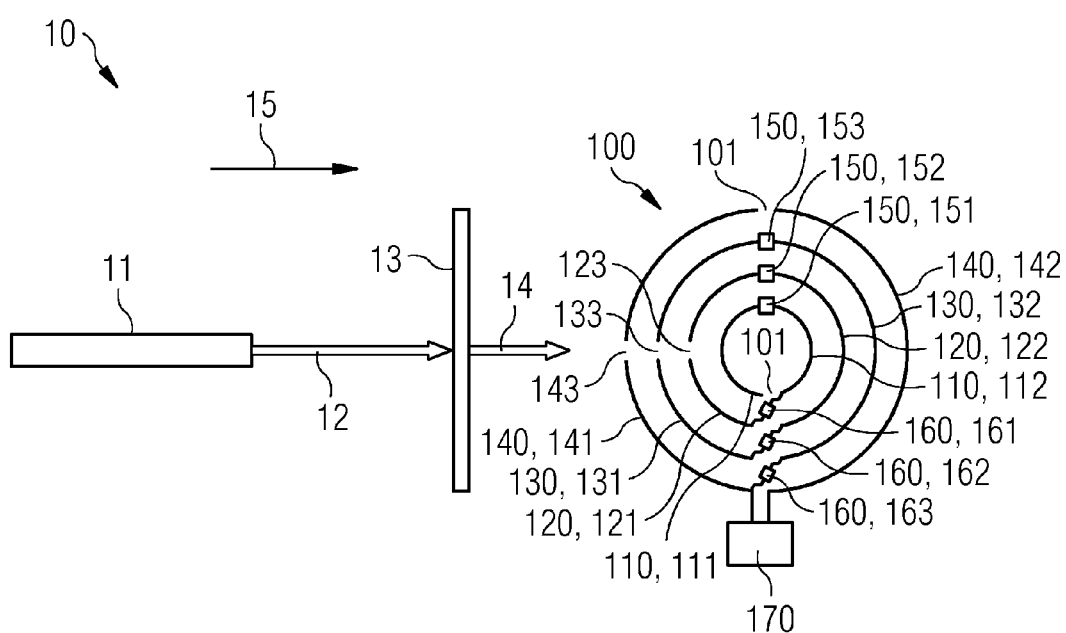
FIG. 1 shows a schematic illustration of a device for irradiating a target with a particle beam.

In a very schematic illustration, FIG. 1 shows a device 10 for irradiating a target with a particle beam. By way of example, the device 10 can serve to produce radioisotopes or neutrons. By way of example, the produced radioisotopes and/or neutrons can be used for technical, scientific or medical purposes.

The device 10 comprises a particle accelerator 11 for generating a first particle beam 12 of charged particles. By way of example, the particle accelerator 11 can be embodied as a linear accelerator. In particular, the particle accelerator 11 can, for example, be embodied as a radiofrequency linear accelerator. By way of example, the first particle beam 12 can be a beam of accelerated protons. The first particle beam 12 moves in a beam direction 15.

The device 10 furthermore comprises a target 13. In the beam direction 15, the target 13 is disposed downstream of the particle accelerator 11, and so the first particle beam 12 impacts on the target 13. The particles of the first particle beam 12 impacting on the target 13 can cause desired nuclear reactions in the target 13 in order, for example, to generate radioisotopes or neutrons. In the beam direction 15, the target 13 may have a thinner embodiment than in the case of conventional devices for irradiating targets with particle beams. An advantage of this is that less energy is deposited in the target 13. The target 13 heats less strongly because of this, and so the first particle beam 12 may therefore have a higher particle density than in the case of conventional devices for irradiating targets with particle beams. A thin target 13 in the beam direction 15 also minimizes the x-ray bremsstrahlung generated in the target 13.

The particles of the first particle beam 12 impacting on the target 13 may have an energy $E_{in}$. In the target 13, the particles of the first particle beam 12 lose an energy dE. At least some particles in the first particle beam 12 completely pass through the target 13 and leave the target 13 as a second particle beam 14. The particles of the second particle beam 14 then have an energy $E_{out}=E_{in}-dE$. The second particle beam 14 likewise extends in the beam direction 15, i.e. it continues its path in the same direction as the first particle beam 12.

Figure 2:
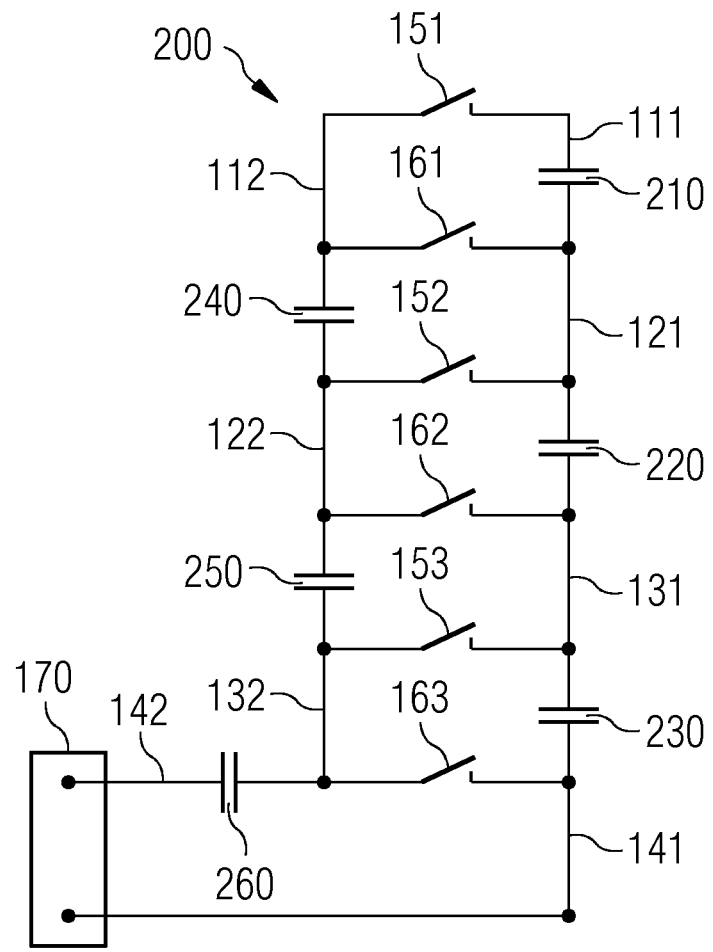
FIG. 2 shows an equivalent circuit diagram of a device for collecting electrically charged particles.

Each particle of the second particle beam 14 has the energy $E_{out}$. In order to recuperate this energy, the device 10 for irradiating a target with a particle beam comprises a device 100 for collecting electrically charged particles. The device 100 for collecting electrically charged particles is provided for collecting the particles of the second particle beam 14 and for converting the kinetic energy $E_{out}$ of said particles of the second particle beam 14 into electrical energy. To this end, the device 100 for collecting electrically charged particles is disposed downstream of the target 13 in the beam direction 15. FIG. 1 shows a schematic section through the device 100 for collecting electrically charged particles. FIG. 2 shows an equivalent circuit diagram 200 of the device 100 for collecting electrically charged particles.

The device 100 for collecting electrically charged particles comprises a first shell 110, a second shell 120 arranged concentrically around the first shell 110, a third shell 130 arranged concentrically around the second shell 120 and a fourth shell 140 arranged concentrically around the third shell 130. However, the embodiment of the device 100 for collecting electrically charged particles comprising four shells 110, 120, 130, 140, as depicted in FIGS. 1 and 2, is merely exemplary. In other embodiments, the device 100 for collecting electrically charged particles may comprise merely two shells, three shells or more than four shells. The shells 110, 120, 130, 140 preferably have a spherical embodiment, i.e. they are embodied as spherical shells. The shells 110, 120, 130, 140 are arranged concentrically with respect to one another, are spaced apart from one another and insulated electrically from one another. To this end, e.g. a dielectric or vacuum may be arranged between the individual shells 110, 120, 130, 140.

Each shell 110, 120, 130, 140 is respectively subdivided into a first half shell and a second half shell by means of an insulation gap 101. The first shell 110 is subdivided into a first half shell 111 and a second half shell 112. The second shell 120 is subdivided into a first half shell 121 and a second half shell 122. The third shell 130 is subdivided into a first half shell 131 and a second half shell 132. The fourth shell 140 is subdivided into a first half shell 141 and a second half shell 142. The half shells 111, 112, 121, 122, 131, 132, 141, 142 are respectively electrically insulated from one another by the insulation gap 101. By way of example, an insulating material or a vacuum may be arranged in the insulating gap 101. The first half shells 111, 121, 131, 141 face the target 13. The second half shells 112, 122, 132, 142 face away from the target 13.

The first half shell 121 of the second shell 120 has an opening 123. The first half shell 131 of the third shell 130 has an opening 133. The first half shell 141 of the fourth shell 140 has an opening 143. The openings 123, 133, 143 are arranged coaxially with respect to one another and against the beam direction 15 in the direction of the target 13. Therefore, particles of the second particle beam 14 are able to enter, in the beam direction 15, through the openings 143, 133, 123 into the device 100 for collecting electrically charged particles and advance up to the first half shell 111 of the first shell 110. The first half shell 111 of the first shell 110 does not have an opening. Therefore, particles of the second particle beam 14 entering into the device 100 for collecting electrically charged particles impact on the first half shell 111 of the first shell 110.

A first switch 151 is arranged between the first half shell 111 and the second half shell 112 of the first shell 110. A second switch 152 is arranged between the first half shell 121 and the second half shell 122 of the second shell 120. A third switch 153 is arranged between the first half shell 131 and the second half shell 132 of the third shell 130. The first switch 151, the second switch 152 and the third switch 153 together form a first group of switches 150. The switches 151, 152, 153 of the first group of switches 150 are provided to be switched together.

A fifth switch 161 is arranged between the second half shell 112 of the first shell 110 and the first half shell 121 of the second shell 120. A sixth switch 162 is arranged between the second half shell 122 of the second shell 120 and the first half shell 131 of the third shell 130. A seventh switch 163 is arranged between the second half shell 132 of the third shell 130 and the first half shell 141 of the fourth shell 140. The fifth switch 161, the sixth switch 162 and the seventh switch 163 together form a second group of switches 160. The switches 161, 162, 163 of the second group of switches 160 are provided to be opened and closed together.

The design of the device 100 for collecting electrically charged particles is reminiscent in terms of its design of a high-voltage cascade. However, in this case, the diodes of a high-voltage cascade have been replaced by the switches of the groups of switches 150, 160.

It is clear from the equivalent circuit diagram 200 in FIG. 2 that the first half shell 111 of the first shell 110 and the first half shell 121 of the second shell 120 together form a first capacitor 210. The first half shell 121 of the second shell 120 and the first half shell 131 of the third shell 130 together form a second capacitor 220. The first half shell 131 of the third shell 130 and the first half shell 141 of the fourth shell 140 together form a third capacitor 230. The second half shell 112 of the first shell 110 and the second half shell 122 of the second shell 120 together form a fourth capacitor 240. The second half shell 122 of the second shell 120 and the second half shell 132 of the third shell 130 together form a fifth capacitor 250. The second half shell 132 of the third shell 130 and the second half shell 142 of the fourth shell 140 together form a sixth capacitor 260.

During operation of the device 10 for irradiating a target with a particle beam and the device 100 for collecting electrically charged particles, the first half shell 141 of the fourth shell 140 may be connected to a ground potential. The charged particles of the second particle beam 14 entering into the device 100 through the openings 143, 133, 123 impact on the first half shell 111 of the first shell 110 and charge the latter. By way of example, if the particles of the second particle beam 14 are protons, the first half shell 111 of the first shell 110 is charged to a high positive potential in relation to the first half shell 141 of the fourth shell 140. A third of the electric high voltage emerging from the potential difference between the first half shell 111 of the first shell 110 and the first half shell 141 of the fourth shell 140 drops over each capacitor 210, 220, 230, 240, 250, 260. If the switches 151, 152, 153 of the first group of switches 150 are now closed while the switches 161, 162, 163 of the second group of switches 160 are opened, there is a transfer between the capacitors 210, 220, 230, 240, 250, 260, resulting in a voltage drop of one sixth of the high voltage between the first half shell 141 and the second half shell 142 of the fourth shell 140.

If, subsequently, the switches 151, 152, 153 of the first group of switches 150 are opened and the switches 161, 162, 163 of the second group of switches 160 are closed, there is a transfer between the capacitors 210, 220, 230, 240, 250, 260, which leads to a voltage drop of one sixth of the high voltage between the second half shell 142 and the first half shell 141 of the fourth shell 140. Thus, the output voltage between the half shells 141, 142 has the same magnitude as previously, but an inverted polarity.

Therefore, by continuous alternate opening and closing of the switches of the first group of switches 150 and of the second group of switches 160, it is possible to generate an AC voltage between the half shells 141, 142 of the fourth shell 140, the peak value of which is one sixth of the magnitude of the high voltage between the first half shell 111 of the first shell and the first half shell 141 of the fourth shell 140. The value of one sixth in this case emerges from the presence of four shells 110, 120, 130, 140. If the device 100 were merely to comprise three shells, this would result in a division ratio of 4. In the case of merely two shells, this would result in a division ratio of 2. In the case of five shells, this would result in a division ratio of 8. The frequency of the AC voltage which can be picked up between the first half shell 141 and the second half shell 142 of the fourth shell 140 corresponds to the frequency with which the groups of switches 150, 160 are switched. Since the first half shells 141, 131, 121, 111 are on potential levels which increase toward the center of the device 100 during operation of the device 100 for collecting electrically charged particles, the particles of the second particle beam 14 are increasingly decelerated during their entry into the device 100 in the beam direction 15. The voltage between the first half shell 111 of the first shell 110 and the first half shell 141 of the fourth shell 140 is adapted in such a way that particles entering into the device 100 lose all their kinetic energy on their path to the first half shell 111 of the first shell 110. As a result of this, the device 100 completely uses the kinetic energy of the particles of the second particle beam 14.

The output connectors of the device 100 for collecting electrically charged particles, formed by the first half shell 141 and the second half shell 142 of the fourth shell 140, may be connected to a rectifier 170 in order to rectify the AC voltage that can be picked up on the output connectors. By way of example, the rectified AC voltage can be used for charging an energy storage, for example a capacitor.

Figure 3:
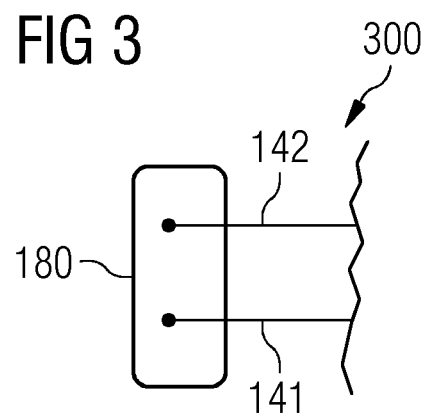
FIG. 3 shows a section of an equivalent circuit diagram of a development of a device for collecting electrically charged particles.

In a second equivalent circuit diagram 300, FIG. 3 shows a section of a development of the device 100 for collecting electrically charged particles. All that are depicted in FIG. 3 are the output connectors formed by the first half shell 141 and the second half shell 142 of the fourth shell 140 of the device 100. FIG. 3 shows that the output connectors may be connected to an AC voltage generator 180. At the start of operation of the device 100 for collecting electrically charged particles, the AC voltage generator 180 serves to charge the shells 110, 120, 130, 140 of the device 100 for collecting electrically charged particles to potentials which increase toward the center of the device 100. This enables a more efficient operation of the device 100 for collecting electrically charged particles already from the start of operation of the device 100 for collecting electrically charged particles. An AC voltage is applied between the first half shell 141 and the second half shell 142 of the fourth shell 140 by the AC voltage generator 180 for pre-charging purposes. At the same time, the switches of the first group of switches 150 and of the second group of switches 160 are alternately opened and closed synchronously with the AC voltage generated by the AC voltage generator 180.

The invention claimed is:

1. A device for collecting electrically charged particles, comprising a first shell and a second shell arranged concentrically around the first shell,
   wherein each one of the shells is respectively subdivided into a first half shell and a second half shell,
   wherein a first switch is arranged between the first half shell of the first shell and the second half shell of the first shell,
   wherein a second switch is arranged between the second half shell of the first shell and the first half shell of the second shell,
   wherein the first half shell of the second shell comprises an opening.

2. The device as claimed in claim 1, wherein at least one further shell is arranged concentrically around the second shell, wherein each further shell is respectively subdivided into a first half shell and a second half shell, wherein the first half shell of each further shell respectively comprises an opening, wherein, in each shell except for the outermost shell, a first switch (150) is respectively arranged between the respective first half shell and the respective second half shell and a second switch is respectively arranged between the respective second half shell and a first half shell of the respectively next further out shell.

3. The device as claimed in claim 1, wherein the shells have a spherical embodiment.

4. The device as claimed in one of the preceding claim 1, wherein a rectifier is arranged between the first half shell of an outermost shell and the second half shell of the outermost shell.

5. The device as claimed in claim 1, wherein the device comprises an AC source, which is connectable to the first half shell of an outermost shell and the second half shell of the outermost shell.

6. A method for operating a device for collecting electrically charged particles, wherein the device is embodied as claimed in claim 1, wherein all first switches and all second switches are alternately opened and closed.

7. A method for operating a device for collecting electrically charged particles, wherein the device is embodied as claimed in claim 5, wherein all first switches and all second switches are alternately opened and closed and, wherein the AC source is connected to the first half shell of the outermost shell and the second half shell of the outermost shell at the start of the method, wherein all first switches and all second switches are alternately opened and closed synchronously with the clock of an AC voltage generated by the AC source.

8. A device for irradiating a target with a particle beam, comprising a particle accelerator for generating a beam of charged particles, a target and a device for collecting electrically charged particles as claimed claim 1.

9. The device as claimed in claim 8, wherein the particle accelerator is embodied as a linear accelerator.

10. A method for operating a device for irradiating a target with a particle beam, wherein the device is embodied as claimed in claim 8, wherein the beam of charged particles is directed onto the target in such a way that at least some particles penetrate the target, wherein the device for collecting electrically charged particles is arranged in such a way that at least some of the particles penetrating the target enter the device for collecting electrically charged particles.

* * * * *